(12) United States Patent
Ullberg

(10) Patent No.: US 11,714,205 B2
(45) Date of Patent: Aug. 1, 2023

(54) SENSOR UNIT, RADIATION DETECTOR AND METHOD OF MANUFACTURING A SENSOR UNIT

(71) Applicant: XCOUNTER AB, Sollentuna (SE)

(72) Inventor: Christer Ullberg, Sollentuna (SE)

(73) Assignee: XCounter AB, Danderyd (SE)

( * ) Notice: Subject to any disclaimer, the term of this patent is extended or adjusted under 35 U.S.C. 154(b) by 0 days.

(21) Appl. No.: 17/055,337

(22) PCT Filed: May 15, 2019

(86) PCT No.: PCT/EP2019/062442
§ 371 (c)(1),
(2) Date: Nov. 13, 2020

(87) PCT Pub. No.: WO2019/219733
PCT Pub. Date: Nov. 21, 2019

(65) Prior Publication Data
US 2021/0223420 A1     Jul. 22, 2021

(30) Foreign Application Priority Data
May 15, 2018   (SE) .................................. 1850561-0

(51) Int. Cl.
*G01T 1/29* (2006.01)
*G01T 1/24* (2006.01)
*H01L 27/146* (2006.01)

(52) U.S. Cl.
CPC ............ *G01T 1/2928* (2013.01); *G01T 1/247* (2013.01); *H01L 27/1469* (2013.01);
(Continued)

(58) Field of Classification Search
CPC . G01T 1/2928; G01T 1/247; H01L 27/14636; H01L 27/14659; H01L 27/14661; H01L 27/1469; H01L 27/146
See application file for complete search history.

(56) References Cited

U.S. PATENT DOCUMENTS 6,323,475 B1    11/2001   Spartiotis et al.
2005/0285043 A1*  12/2005   Nascetti ................ G01T 1/026
                                                              250/370.09
(Continued)

FOREIGN PATENT DOCUMENTS

GB     2322233     8/1998
GB     2332562     6/1999
(Continued)

OTHER PUBLICATIONS

International Preliminary Report mailed in PCT/EP2019/062422 dated Nov. 17, 2020.
(Continued)

*Primary Examiner* — Kiho Kim
(74) *Attorney, Agent, or Firm* — Laurence & Phillips IP Law

(57) ABSTRACT

A sensor unit (14) for a radiation detector (12), the sensor unit (14) comprising a conversion element (22) comprising a plurality of imaging pixels (30), wherein each imaging pixel (30) is configured to directly convert radiation into an electrical charge and wherein each imaging pixel (30) comprises a charge collection electrode (28); and a readout substrate (24) comprising a plurality of readout pixels (32), wherein each readout pixel (32) is connected to an associated imaging pixel (30) by means of an interconnection (36) at a connection position on the charge collection electrode (28); wherein each readout pixel (32) has a smaller area than an associated imaging pixel (30) of the plurality of imaging pixels (30); and wherein the connection positions in relation to the charge collection electrodes (28) are varied with respect to a neighboring charge collection electrode (28). A radiation detector (12) and a method of manufacturing a sensor unit (14) are also provided.

20 Claims, 4 Drawing Sheets

(52) U.S. Cl.
CPC .. *H01L 27/14636* (2013.01); *H01L 27/14659* (2013.01); *H01L 27/14661* (2013.01)

(56) References Cited

U.S. PATENT DOCUMENTS

2010/0187429 A1* 7/2010 Engel ................ G01T 1/2928
250/370.09
2020/0393581 A1* 12/2020 Luhta ..................... G01T 7/00

FOREIGN PATENT DOCUMENTS

| JP | 2001-527294 | | 12/2001 |
| JP | 2011089963 | | 5/2011 |
| JP | 2011089963 A | * | 5/2011 |
| KR | 2011-0138624 | | 12/2011 |

OTHER PUBLICATIONS

International Search Report mailed in PCT/EP2019/062422 dated Nov. 21, 2019.
Written Opinion mailed in PCT/EP2019/062422 dated Nov. 21, 2019.
Notice of Final Rejection in Korean Patent Appln. No. 2020-7032701 dated Oct. 31, 2022.
Reply to Search Opinion/Written Opinion in EP Patent Appln. No. EP19725672.0 filed on Jun. 15, 2021.
Search Opinion/Written Opinion in EP Patent Appln. No. EP19725672.0 filed on Dec. 22, 2020.
Korean Patent Appln. No. 2020-7032701, Request for Continued Examination dated Mar. 2, 2023.
Korean Patent Appln. No. 2020-7032701, Response Remarks to Final Rejection dated Mar. 2, 2023.
Korean Patent Appln. No. 2020-7032701, Notice of Preliminary Rejection dated Mar. 20, 2023.

* cited by examiner

SENSOR UNIT, RADIATION DETECTOR AND METHOD OF MANUFACTURING A SENSOR UNIT

TECHNICAL FIELD

The present disclosure generally relates to a sensor unit for a radiation detector. In particular, a sensor unit for a radiation detector, a radiation detector comprising at least one sensor unit, and a method of manufacturing a sensor unit, are provided.

BACKGROUND

Direct conversion radiation detectors utilize photoconductors, such as a cadmium telluride (CdTe) conversion element, to capture and convert incident X-ray photons directly into electrical charge. Photoconductor sensor modules cannot be made arbitrarily large. For this reason, a large radiation detector needs to be built from smaller sensor modules. The smaller sensor modules need to be electrically connected to power and readout circuits. In some implementations, standard connections are made with wire bonding from one or more sides of an electronics layer, such as a readout application-specific integrated circuit (ASIC) substrate. Thereby, input and output (I/O) signals can be routed to and from the electronics layer. However, this solution imposes a limitation on the maximum achievable size of the radiation detector.

In order to cover the exposed wire bonding area, it is possible to provide a radiation detector comprising tilted sensor modules such that the wire bonding area of one sensor module is covered by the conversion element of an adjacent sensor module. In this way, gaps between the sensor modules in an imaging plane can be avoided. However, this solution is complicated and gives different distances to an object to be imaged for different positions of the detector. Furthermore, the radiation angle is increased and shadows may arise.

SUMMARY

As an alternative to wire bonding from one or more sides of an electronics layer, the connections of the sensor modules to power and readout circuits can be made through the readout ASIC substrate by means of vias. The vias are often referred to as through silicon vias (TSV) although they may be fabricated in substrates of materials other than silicon. In this case, the connections are made on the backside (with reference to the conversion element). Smaller sensor modules can thereby be stacked to form a radiation detector of a specified size.

One problem with through silicon vias is that it requires space to go through the readout substrate, e.g. a silicon substrate. The space taken up by the diameter of the via cannot be used for active circuitry. Some signals in the readout substrate need additional logic for driving and receiving signals as well as other functions.

In a photon counting pixelated detector, the space in each readout pixel is very limited and there is therefore no space for additional logic functions needed for I/O (input/output) signals that can be reserved in every readout pixel. In most conventional direct conversion detectors, the area (or footprint) of the imaging pixels and the readout pixels match 1 to 1. That is, the imaging pixels and the readout pixels have the same area and the imaging pixels are aligned above the readout pixels (in the imaging direction).

One object of the present disclosure is to provide a sensor unit for a radiation detector, which sensor unit enables a simpler manufacturing process.

A further object of the present disclosure is to provide a sensor unit for a radiation detector, which sensor unit has an improved signal integrity.

A still further object of the present disclosure is to provide a sensor unit for a radiation detector, which sensor unit has a compact design.

A still further object of the present disclosure is to provide a sensor unit for a radiation detector, which sensor unit solves several or all of the foregoing objects in combination.

A still further object of the present disclosure is to provide a radiation detector comprising at least one sensor unit, which radiation detector solves one, several or all of the foregoing objects.

A still further object of the present disclosure is to provide a method of manufacturing a sensor unit, which method solves one, several or all of the foregoing objects.

According to one aspect, there is provided a sensor unit for a radiation detector, the sensor unit comprising a conversion element comprising a plurality of imaging pixels, wherein each imaging pixel is configured to directly convert radiation into an electrical charge and wherein each imaging pixel comprises a charge collection electrode; and a readout substrate comprising a plurality of readout pixels, wherein each readout pixel is connected to an associated imaging pixel by means of an interconnection at a connection position on the charge collection electrode; wherein each readout pixel has a smaller area than an associated imaging pixel of the plurality of imaging pixels; and wherein the connection positions in relation to the charge collection electrodes are varied with respect to a neighboring charge collection electrode.

By designing each readout pixel with a smaller area than an associated imaging pixel and by varying the connection positions in relation to the charge collection electrodes, it is possible to provide areas for common electronics, e.g. electronics common for the imaging pixels, without having to take space from the imaging pixels. The areas may be constituted by streets available for logic such as I/O buffers etc. The sensor unit thereby utilizes the circumstance that for a direct conversion radiation detector, it does not matter where on the charge collection electrode the connection position for the interconnection is positioned. The connection position can be arranged on different parts of the charge collection electrode to thereby create one or more free areas that are not provided in the readout pixels and that can be used for other circuitry and vias.

The area of each readout pixel may be at least 1% smaller than the area of an associated imaging pixel. In other aspects, the area of each readout pixel may be at least 5%, 10%, 20% or 40% smaller than the area of an associated imaging pixel. These areas of the readout pixels and the imaging pixels may be parallel with an imaging plane of the radiation detector.

The definition that the connection positions in relation to the charge collection electrodes are varied implies that center to center distances between the connection positions are different in at least one direction. For example, an offset distance from the connection positions on the charge collection electrodes may be incrementally increased and/or decreased in at least one direction in an extension plane of the sensor unit. Thus, the readout pixels and the imaging pixels are skewed.

The sensor unit may alternatively be referred to as a sensor module or tile. The radiation detector may comprise only one sensor unit. Alternatively, two or more sensor units may be combined to provide a radiation detector.

Throughout the present disclosure, the conversion element may be referred to as a photodetector and may be constituted by (or comprise) at least one semiconductor substrate, such as a CdTe or a cadmium zinc telluride (CdZnTe or CZT) substrate. The conversion element may comprise a continuous conversion substrate or several discrete conversion portions. In any case, a conversion element according to the present disclosure may be constituted by an element, such as a substrate, configured to produce one or more charge carriers in response to incident radiation.

The imaging pixels may alternatively be referred to as sensor pixels or crystal pixels. The readout pixels may alternatively be referred to as readout cells.

The readout substrate may comprise, or be constituted by, a readout circuit, such as an ASIC. The charge collection electrode may alternatively be referred to as a detector pad.

The plurality of readout pixels may be arranged in at least two readout groups such that at least one street is formed between the readout groups. In this case, the readout pixels in each readout group may be more compactly arranged than the associated imaging pixels. Alternatively, each readout group may have a smaller area than an associated imaging group, wherein each imaging pixel in each imaging group is connected to an associated readout pixel in a corresponding readout group. The imaging pixels associated with the readout pixels of a readout group thus form an imaging group associated with the readout group.

Each readout pixel may have a readout pixel first width in a first direction and each imaging pixel may have an imaging pixel first width in the first direction, and the readout pixel first width may be smaller than the imaging pixel first width. In this case, the readout pixels may be arranged in a plurality of readout groups and the readout pixels in each readout group may be more compactly arranged in the first direction than the associated imaging pixels such that at least one street is formed in the first direction between the readout groups. Alternatively, the readout pixels may be arranged in a plurality of readout groups and each readout group may have a first width in the first direction that is smaller than a first width in the first direction of each imaging group such that at least one street is formed in the first direction between the readout groups, wherein each imaging pixel in each imaging group is connected to the associated readout pixel in the corresponding readout group.

According to one non-limiting example, the imaging pixels each has a dimension in the first direction of approximately 150 μm and the readout pixels each has a dimension in the first direction of approximately 143 μm. In this case, the at least one street may have a width in the first direction of approximately 112 μm (for a street between two readout groups, each comprising eight readout pixels in the first direction).

Furthermore, each readout pixel may have a readout pixel first width in a first direction and a readout pixel second width in a second direction (e.g. perpendicular to the first direction), each imaging pixel may have an imaging pixel first width in the first direction and an imaging pixel second width in the second direction, wherein the readout pixel first width is smaller than the imaging pixel first width, and wherein the readout pixel second width is smaller than the imaging pixel second width. Thus, each readout pixel may have a first width in a first direction that is smaller than a first width in the first direction of each imaging pixel and each readout pixel may have a second width in a second direction that is smaller than a second width in the second direction of each imaging pixel. In this case, the readout pixels may be arranged in a plurality of readout groups and the readout pixels in each readout group may be more compactly arranged in the first direction and in the second direction than the associated imaging pixels such that at least one street is formed in the first direction and in the second direction between the readout groups. Alternatively, the readout pixels may be arranged in a plurality of readout groups and each readout group may have a first width in the first direction and a second width in the second direction that is smaller than a first width in the first direction and a second width in the second direction of each imaging group such that at least one street is formed in the first direction and in the second direction between the readout groups, wherein each imaging pixel in each imaging group is connected to the associated readout pixel in the corresponding readout group.

The sensor unit may further comprise vias arranged in the at least one street. A plurality of connections to readout pixels may be provided in each via, for example 20 to 500 connections.

The sensor unit may further comprise common electronics for at least two readout pixels at least partly arranged in the at least one street. In another aspect, the sensor unit may further comprise common electronics for at least one readout group, where the common electronics at least partly arranged in the at least one street. The common electronics may comprise a power distribution network, digital circuits, one or more microprocessors, and/or one or more memories.

Each readout pixel may comprise readout pixel electronics with at least one electronic component specific for an associated readout pixel. The at least one electronic component may comprise an amplifier, an integrator, a comparator and/or a counter for counting photon pulses.

Each interconnection may comprise a solder bump, e.g. by direct bonding. Each readout pixel may comprise a readout contact pad to which the solder bump can be deposited. An interconnection according to the present disclosure may however alternatively be constituted by any type of connection member for creating electrical contact, e.g. between an imaging pixel and a readout pixel.

According to another aspect, the sensor unit includes a conversion element and a readout substrate that have substantially the same area as each other. Outer edge imaging pixels of the conversion element can define the boundaries of a conversion element effective area. Outer edge readout pixels (and outer common electronics, if any) of the readout substrate can define the boundaries of a readout substrate effective area. The sensor unit includes a conversion element with a conversion element effective area having a substantially same area as the readout substrate effective area of a readout substrate. In some examples, the substantially same area refers to a conversion element effective area and a readout substrate effective area that is within 1% of each other. In other examples, the substantially same area refers to a conversion element effective area and a readout substrate effective area that is within 5% of each other.

According to a further aspect, there is provided a radiation detector comprising at least one sensor unit according to the present disclosure. Throughout the present disclosure, the radiation detector may be constituted by a direct conversion radiation detector. The radiation detector may alternatively be referred to as a radiation imaging device.

According to a further aspect, there is provided a radiation detector comprising at least two sensor units according to the present disclosure, wherein an edge imaging pixel (or row or column of edge imaging pixels) of each sensor unit is within one imaging pixel width of an edge imaging pixel (or row or column of edge imaging pixels) of an adjoining sensor unit. In another aspect, the edge imaging pixel (or row or column of edge imaging pixels) of each sensor unit is within less than two, five, or ten imaging pixel widths of an edge imaging pixel (or row or column of edge imaging pixels) of an adjoining sensor unit.

According to a further aspect, there is provided an imaging apparatus comprising at least one sensor unit according to the present disclosure or at least one radiation detector according to the present disclosure.

According to a further aspect, there is provided a method of manufacturing a sensor unit with a conversion element connected to a readout substrate, the method comprising providing the conversion element comprising a plurality of imaging pixels, wherein each imaging pixel is configured to directly convert radiation into an electrical charge and wherein each imaging pixel comprises a charge collection electrode, wherein a plurality of outer edge imaging pixels of the conversion element define boundaries of a conversion element effective area; providing a readout substrate comprising a plurality of readout pixels, wherein a plurality of outer edge readout pixels of the readout substrate define boundaries of a readout substrate effective area; and connecting each charge collection electrode of the imaging pixels on a surface of the conversion element to a readout electrode of an associated readout pixel on a first surface of the readout substrate by means of an interconnection at a connection position on the charge collection electrode, wherein the conversion element effective area has a substantially same area as the readout substrate effective area.

The readout substrate may include readout pixel electronics with at least one electronic component specific for each readout pixel and common electronics for at least two readout pixels formed in at least one street between readout groups of the readout pixels. In another aspect, the readout substrate may include readout pixel electronics with at least one electronic component specific for each readout pixel and common electronics for at least one readout group formed in at least one street between readout groups of the readout pixels.

The method may further comprise etching at least one via through the at least one street of the readout substrate, wherein the at least one street is void of the readout pixel electronics for specific readout pixels.

The method may further comprise providing a support substrate comprising a plurality of support contact pads and a plurality of transmission lines coupled to the support contact pads; and connecting the support contact pads on a surface of the support substrate to one or more of the readout pixels or to common electronics through at least one via on a second surface of the readout substrate, opposite the first surface, by means of an interconnection.

Connecting the charge collection electrode to the readout substrate or connecting the support substrate to the readout substrate may use solder bump bonding, direct bonding, or flip-chip bonding.

The conversion element effective area may be at least 1% larger than the readout substrate effective area.

According to a further aspect, there is provided a sensor unit manufactured by any method according to the present disclosure or a sensor unit resulting from any method according to the present disclosure.

BRIEF DESCRIPTION OF THE DRAWINGS

Further details, advantages and aspects of the present disclosure will become apparent from the following embodiments taken in conjunction with the drawings, wherein.

DETAILED DESCRIPTION

Figure 1:
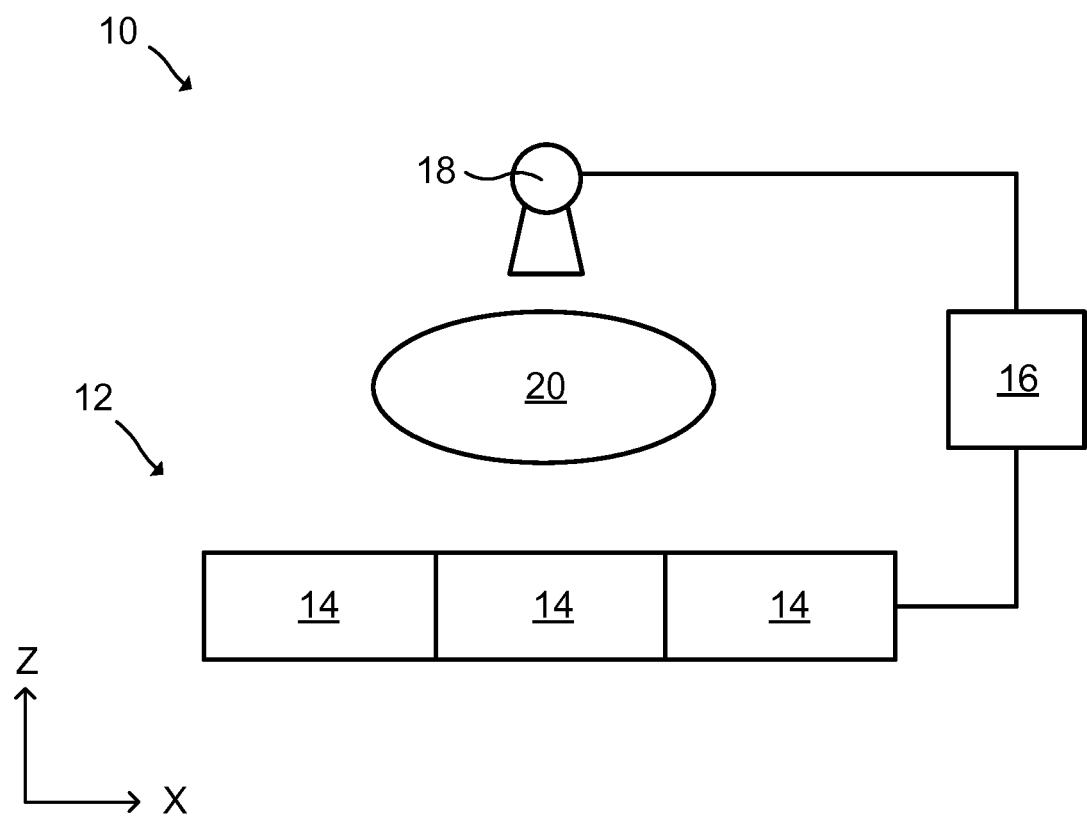
FIG. 1: schematically represents a side view of an imaging apparatus comprising a radiation detector.

In the following, a sensor unit for a radiation detector, a radiation detector comprising at least one sensor unit, and a method of manufacturing a sensor unit, will be described. The same reference numerals will be used to denote the same or similar structural features.

FIG. 1 schematically represents a side view of an imaging apparatus 10 comprising a radiation detector 12. The radiation detector 12 of this example is formed of a plurality of sensor units 14 according to the present disclosure. The radiation detector 12 may for example comprise one or more coupling mechanism that allows for connecting the sensor units 14 together. The coupling mechanisms may for example connect support substrates of two adjoining sensor units 14. The sensor units 14 may also be connected via interface circuits.

A radiation detector according to the present disclosure may however alternatively comprise only one sensor unit. The imaging apparatus to may for example be a computed tomography (CT) device.

The imaging apparatus to comprises a control unit 16 and a radiation source 18, such as an X-ray tube, for emitting X-rays that are transmitted through an object 20 to be imaged, for example through the body of a patient. After transmission through the object 20, the X-rays reach the radiation detector 12 where the X-rays are detected and converted into signals representing a spatially resolved projection image of the object 20. The control unit 16 may be configured to acquire 2D projection images. The acquired 2D images may be used to reconstruct, for example 3D images, of the object 20 according to known principles of computed tomography.

FIG. 1 further shows two Cartesian coordinates X and Z of a three-dimensional Cartesian coordinate system X, Y, Z for referencing purposes. The radiation detector 12 of this example is planar and oriented in the XY-plane. Thus, an imaging plane of the radiation detector 12 is parallel with the XY-plane. The imaging apparatus 10 and the radiation detector 12 may however be oriented arbitrarily in space.

Figure 2:
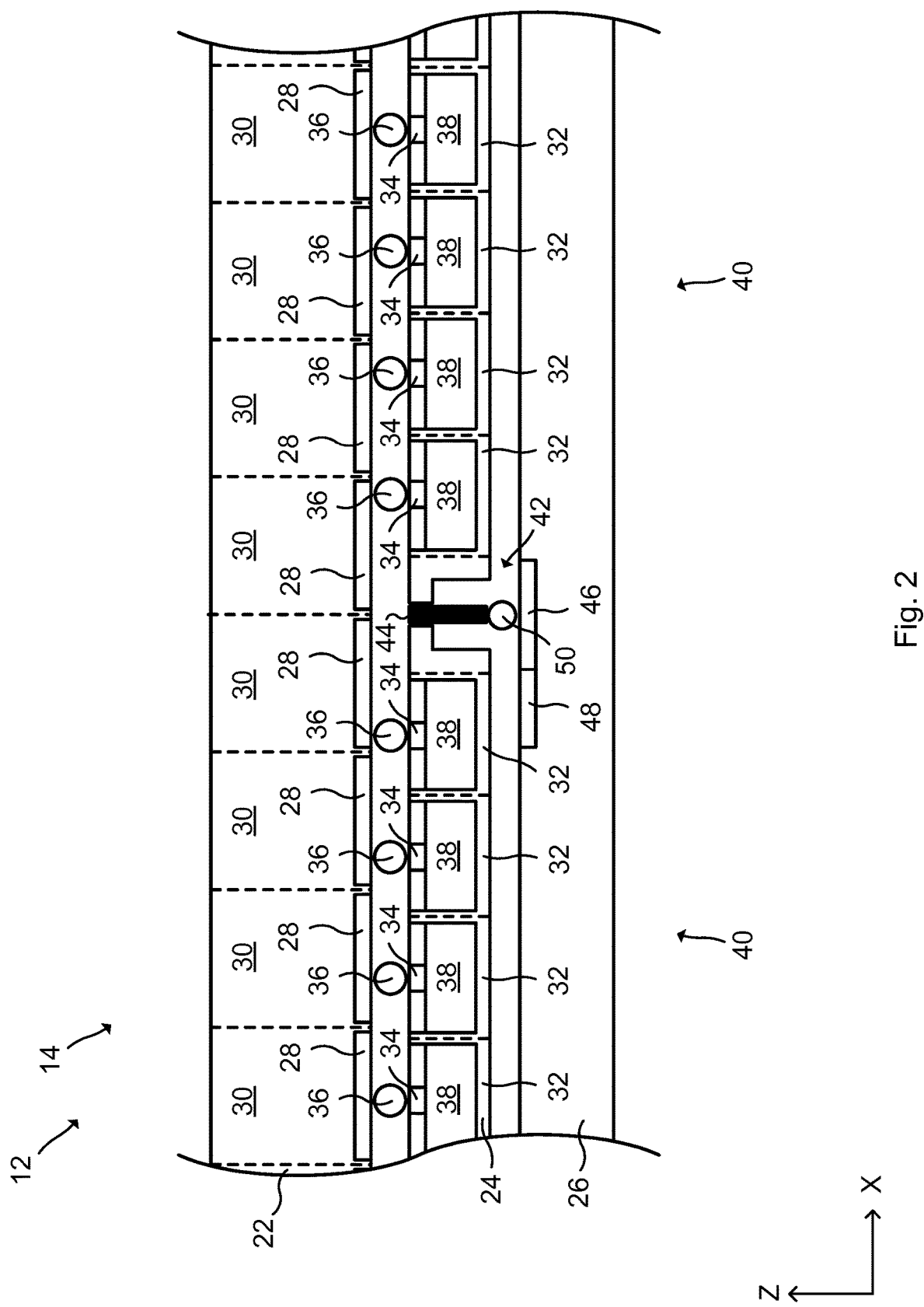
FIG. 2: schematically represents a partial cross-sectional side view of the radiation detector in FIG. 1.

FIG. 2 schematically represents a partial cross-sectional side view of the radiation detector 12 in FIG. 1. In FIG. 2, one of the sensor units 14 of the radiation detector 12 can partially be seen. The sensor unit 14 comprises a conversion element 22, for example a CdTe crystal, and a readout substrate 24, for example a readout ASIC substrate. The readout substrate 24 may comprise a silicon substrate or a substrate of other suitable semiconductor or insulator. The sensor unit 14 further comprises a support substrate 26. The support substrate 26 may comprise a printed circuit board (PCB), for example of ceramic or glass.

The conversion element 22 comprises a plurality of charge collection electrodes 28, here implemented as contact pads embedded in the conversion element 22. The charge collection electrodes 28 define a plurality of imaging pixels 30. The charge collection electrodes 28 are slightly separated from each other such that boundaries between adjacent imaging pixels 30 are formed.

The imaging pixels 30 are evenly distributed over at least a major part of the sensor unit 14, such as over the entire sensor unit 14. The imaging pixels 30 (and the charge collection electrodes 28) each has a quadrangular area, here implemented as a square area. In an example, the area (in the XY-plane) of the charge collection electrode 28 defines the area of the imaging pixel 30. An edge (in the XY-plane) of the charge collection electrode 28 can define an imaging pixel boundary of the imaging pixel 30. An imaging pixel first width in a first direction (e.g. in the X-direction) extends from a maximum distance between two imaging pixel boundaries in the first direction. An imaging pixel second width in a second direction (e.g. in the Y-direction) extends from a maximum distance between two imaging pixel boundaries in the second direction.

The distance in the first direction between an outermost imaging pixel 30 of one sensor unit 14 and an outermost imaging pixel 30 of an adjacent sensor unit 14 may be smaller than, or equal to, the imaging pixel first width. Alternatively, or in addition, the distance in the second direction between an outermost imaging pixel 30 of one sensor unit 14 and an outermost imaging pixel 30 of an adjacent sensor unit 14 may be smaller than, or equal to, the imaging pixel second width.

When X-rays (or other type of ionizing radiation) impinges on the conversion element 22, electron-hole pairs are created inside the conversion element 22 (thus the term "direct conversion") in response to the absorbed energy. Under the influence of an electrical field applied across the conversion element 22, these electrons (holes) are transferred to associated charge collection electrodes 28.

The readout substrate 24 comprises a plurality of readout pixels 32. Each readout pixel 32 comprises a readout electrode 34, here implemented as a contact pad, and is associated with an imaging pixel 30.

The sensor unit 14 further comprises interconnections 36 and each pair of one imaging pixel 30 and one readout pixel 32 is connected by means of an interconnection 36. In FIG. 2, the interconnections 36 are exemplified as solder bumps between the charge collection electrodes 28 and the associated readout electrodes 34. Each readout electrode 34 thereby acts as the input to the associated readout pixel 32. Each readout electrode 34 receives, through an interconnection 36, an electrical signal generated in the conversion element 22 by the absorption of an X-ray photon. The conversion element 22 and the readout substrate 24 may be connected by means of flip-chip bonding, or by any other means of forming electrical contact.

Each readout pixel 32 comprises readout pixel electronics 38 dedicated to the readout pixel 32. Thus, the readout pixel electronics 38 comprise at least one electronic component with a function specific for the associated readout pixel 32. The readout pixel electronics 38 of the readout pixels 32 may for example be suitable for processing or interpreting signals generated by the X-ray photons incident on the conversion element 22. Non-limiting examples of readout pixel electronics 38 include a filter, an amplifier, an integrator, a comparator and/or a counter for counting photon pulses. According to one example, each readout pixel 32 comprises a preamplifier and a comparator for sensing pulse size. In an example, the combined area (in the XY-plane) of the readout pixel electronics and associated features defines the area of the readout pixel 32. An outer edge (in the XY-plane) of a readout pixel electronic feature to another outer edge of another readout pixel electronic feature on an opposite side of the readout pixel 32 can define a boundary of the readout pixel 32. A readout pixel first width in the first direction extends from a maximum distance between two readout pixel boundaries in the first direction. A readout pixel second width in the second direction extends from a maximum distance between two readout pixel boundaries in the second direction.

Each readout pixel 32 has an area in the XY-plane that is smaller than the area of an associated imaging pixel 30 in the XY-plane. For example, the combined area of the readout pixel electronics can have an area in the XY-plane that is smaller than the area of a charge collection electrode 28 in an associated imaging pixel 30 in the XY-plane.

The areas of the readout pixels 32 may be quadrangular. For example, each readout pixel 32 may have a width (or readout pixel first width) in a first direction (e.g. along the X-axis) that is smaller than a width (or imaging pixel first width) in the first direction of an associated imaging pixel 30 and each readout pixel 32 may have a width (or readout pixel second width) in a second direction (e.g. along the Y-axis) that is smaller than a width (or imaging pixel second width) in the second direction of the associated imaging pixel 30. Alternatively, each readout pixel 32 may have a width (or readout pixel first width) in a first direction (e.g. along the X-axis) that is smaller than a width (or imaging pixel first width) in the first direction of an associated imaging pixel 30 and each readout pixel 32 may have a width (or readout pixel second width) in a second direction (e.g. along the Y-axis) that is equal to, or substantially equal to, a width (or imaging pixel second width) in the second direction of the associated imaging pixel 30.

In the example in FIG. 2, it can be seen that the connection positions of the interconnections 36 on the charge collection electrodes 28 are varied with respect to neighboring charge collection electrodes 28. For example, the location of a connection position of the interconnection 36 on the charge collection electrodes 28 may be in a different X location or offset relative to a neighboring charge collection electrode 28. In the partial view of the sensor unit 14 in FIG. 2, eight charge collection electrodes 28 are visible and denoted. The first connection position between the first interconnection 36 from the left is substantially centered on the associated charge collection electrode 28, the second connection position between the second interconnection 36 from the left is offset somewhat to the left in relation to the associated charge collection electrode 28, the third connection position between the third interconnection 36 from the left is further offset to the left in relation to the associated charge collection electrode 28, and the fourth connection position between the fourth interconnection 36 from the left is positioned near the left end of the associated charge collection electrode 28. Conversely, the first connection position between the first interconnection 36 from the right is substantially centered on the associated charge collection electrode 28, the second connection position between the second interconnection 36 from the right is offset somewhat to the right in relation to the associated charge collection electrode 28, the third connection position between the third interconnection 36 from the right is further offset to the right in relation to the associated charge collection electrode 28, and the fourth connection position between the fourth interconnection 36 from the right is positioned near the right end of the associated charge collection electrode 28.

The displacements of the interconnections 36 in relation to the associated charge collection electrodes 28 may be different from the specific example in FIG. 2. That is, the offset distance from the connection positions between the interconnections 36 and the on the charge collection electrodes 28 may be incrementally increased or decreased with either longer or shorter steps.

As can be seen in FIG. 2, due to the varying connection positions of the interconnections 36 in relation to the associated charge collection electrodes 28, two readout groups 4o are formed that are spaced from each other in the X-direction. In this case, the readout pixels 32 in each readout group 40 are more compactly arranged than the associated imaging pixels 30 such that an area, here constituted by a street 42 (in the Y-direction), is formed between the readout groups 40.

The width of the street 42 in the first direction (along the X-axis in FIG. 2) may depend on the difference in width in the first direction of each pair of an imaging pixel 30 and an associated readout pixel 32, and on how many readout pixels 32 that are provided in the first direction in each readout group 40. Thus, a plurality of relatively small differences in width between each imaging pixel 30 and each associated readout pixel 32 can be accumulated to a street 42 with a relatively large width.

The sensor unit 14 further comprises at least one via 44 arranged in the street 42. The via 44 may be formed by etching a stepped hole through the readout substrate 24 and by coating the etched hole. The stepped structure of the hole may be operable to absorb physical strain from thermal expansion of the readout substrate 24. The coating may be useful to prevent short circuiting of the via 44 and another via through the readout substrate 24. The smaller opening (upper opening in FIG. 2) of the hole may have a width of approximately 10-20 μm and the larger opening (lower opening in FIG. 2) of the hole may have a width of approximately 200-300 μm.

One or several connections to readout pixels 32 may be provided in the via 44. The via 44 may be connected to a support contact pad 46 on the support substrate 26 for connection to transmission lines 48. The support contact pad 46 and the transmission lines 48 may be embedded in the support substrate 26 according to FIG. 2, or may be provided on the surface of the support substrate 26. The via 44 thus passes through the readout substrate 24 and electrically connects one or more readout pixels 32 to the transmission lines 48. Multiple readout pixels 32 may share one via 44, as illustrated with the black filling of the via 44 in FIG. 2.

In FIG. 2, the via 44 is connected to the support substrate 26 by means of an interconnection 50, here exemplified as a solder bump. Common electronics for the readout pixels 32 may also be at least partly arranged in the at least one street 42. Non-limiting examples of common electronics for the readout pixels 32 include a power distribution network, digital circuits, one or more microprocessors, and/or one or more memories.

Figure 3:
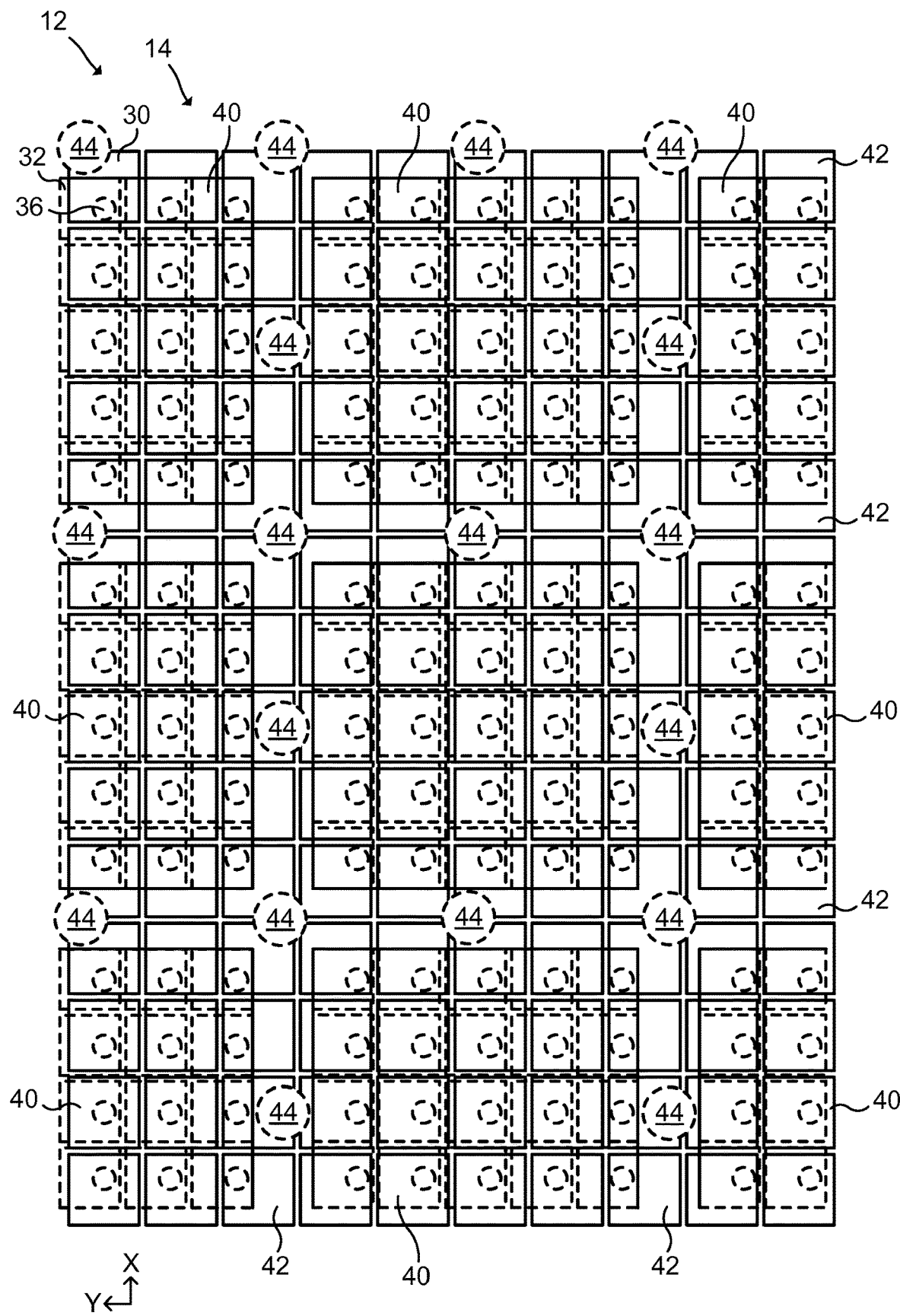
FIG. 3: schematically represents a partial top view of the radiation detector in FIGS. 1 and 2.

FIG. 3 schematically represents a partial top view of the radiation detector 12 in FIGS. 1 and 2. In FIG. 3, the imaging pixels 30 and the readout pixels 32 are square. The imaging pixels 30 are illustrated as squares with solid lines, the readout pixels 32 are illustrated as squares with dashed lines, the interconnections 36 are illustrated as circles with dashed lines, and the vias 44 are illustrated as circles with dashed lines.

As can be seen in FIG. 3, each readout pixel 32 has a first width in the first direction (e.g. along the X-axis) that is smaller than a first width in the first direction of each imaging pixel 30 and each readout pixel 32 has a second width in the second direction (e.g. along the Y-axis) that is smaller than a second width in the second direction of each imaging pixel 30. In the example in FIG. 3, it can be seen that the connection positions of the interconnections 36 on the charge collection electrodes 28 are varied with respect to neighboring charge collection electrodes 28. For example, the location of a connection position of the interconnection 36 on the charge collection electrodes 28 in an associated imaging pixel 30 in readout group 40 may be in a different X and/or Y location or offset relative to a neighboring charge collection electrode 28 in the XY-plane. The neighboring charge collection electrode can be defined as a charge collection electrode of an adjacent imaging pixel 30 or a charge collection electrode of any other imaging pixel 30 in the specific readout group 40.

FIG. 3 further shows that the readout pixels 32 in each readout group 40 are more compactly arranged in the first direction and in the second direction than the associated imaging pixels 30 such that a plurality of streets 42 is formed. Streets 42 are formed in both the first direction and in the second direction between adjacent readout groups 40.

The streets 42 between readout groups 40 can define the readout pixels 32 in one readout group 40 from the readout pixels 32 in and another adjacent readout group 40. An edge (in the XY-plane) between an outer readout pixel 32 and a street 42 can define a boundary of a readout group 40. A readout group first width in the first direction extends from a maximum distance between two readout group boundaries in the first direction. A readout group second width in the second direction extends from a maximum distance between two readout group boundaries in the second direction.

An imaging group refers to the imaging pixels 30 associated with (or coupled to) the readout pixel 32 in a readout group 40. The number of imaging pixels 30 in the imaging group can be the same number as the readout pixels 32 in the readout group 40. An imaging group first width in the first direction extends from a maximum distance between two imaging group boundaries in the first direction. An imaging group second width in the second direction extends from a maximum distance between two imaging group boundaries in the second direction.

Similar to the readout pixels 32 and imaging pixels 30 described above, each readout group 40 has an area in the XY-plane that is smaller than the area of an associated imaging group in the XY-plane. For example, each readout group 40 may have a width (or readout group first width) in a first direction (e.g. along the X-axis) that is smaller than a width (or imaging group first width) in the first direction of an associated imaging group and each readout group 40 may have a width (or readout group second width) in a second direction (e.g. along the Y-axis) that is smaller than a width (or imaging group second width) in the second direction of the associated imaging group. Alternatively, each readout group 40 may have a width (or readout group first width) in a first direction (e.g. along the X-axis) that is smaller than a width (or imaging group first width) in the first direction of an associated imaging group and each readout group 40 may have a width (or readout group second width) in a second direction (e.g. along the Y-axis) that is equal to, or substantially equal to, a width (or imaging group second width) in the second direction of the associated imaging group.

Figure 4:
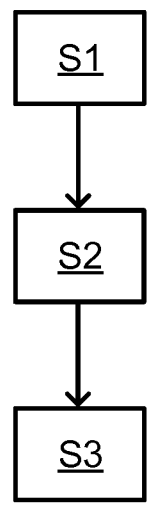
FIG. 4: is a flowchart outlining the general steps of a method of manufacturing a sensor unit.

FIG. 4 is a flowchart outlining the general steps of a method of manufacturing a sensor unit 14 with a conversion element 22 connected to a readout substrate 24. The method comprises a step S1 of providing the conversion element 22 comprising a plurality of imaging pixels 30, wherein each imaging pixel 30 is configured to directly convert radiation into an electrical charge and wherein each imaging pixel 30 comprises a charge collection electrode 28, wherein a plurality of outer edge imaging pixels of the conversion element 22 define boundaries of a conversion element effective area.

The method further comprises a step S2 of providing a readout substrate 24 comprising a plurality of readout pixels 32, wherein a plurality of outer edge readout pixels of the readout substrate 24 define boundaries of a readout substrate effective area. The method further comprises a step S3 of connecting each charge collection electrode 28 of the imaging pixels 30 on a surface of the conversion element 22 to a readout electrode 34 of an associated readout pixel 32 on a first surface of the readout substrate 24 by means of an interconnection 36 at a connection position on the charge collection electrode 28, wherein the conversion element effective area has a substantially same area as the readout substrate effective area.

While the present disclosure has been described with reference to exemplary embodiment, it will be appreciated that the present invention is not limited to what has been described above. For example, it will be appreciated that the dimensions of the parts may be varied as needed. Accordingly, it is intended that the present invention may be limited only by the scope of the claims appended hereto.

The invention claimed is:

1. A sensor unit for a radiation detector, the sensor unit comprising:
a conversion element comprising a plurality of imaging pixels,
wherein each imaging pixel is configured to directly convert radiation into an electrical charge, and
wherein each imaging pixel comprises a charge collection electrode; and
a readout substrate comprising a plurality of readout pixels,
wherein each readout pixel is connected to an associated imaging pixel by means of an interconnection at a connection position on the charge collection electrode;
wherein each readout pixel has a smaller area than an associated imaging pixel of the plurality of imaging pixels;
wherein the connection positions in relation to the charge collection electrodes are varied with respect to a neighboring charge collection electrode; and
wherein the plurality of readout pixels are arranged in at least two readout groups such that at least one street is formed between the readout groups and a separation between adjacent pixels across a corresponding one of the at least one street is greater than a separation between adjacent pixels within a single readout group of the at least two readout groups.

2. The sensor unit according to claim 1,
wherein the readout pixels in each readout group are more compactly arranged than the associated imaging pixels, or wherein each readout group has a smaller area than an associated imaging group, wherein each imaging pixel in each imaging group is connected to an associated readout pixel in a corresponding readout group.

3. The sensor unit according to claim 2, further comprising vias arranged in the at least one street.

4. The sensor unit according to claim 2, further comprising common electronics for at least two readout pixels at least partly arranged in the at least one street.

5. The sensor unit according to claim 1,
wherein each readout pixel has a readout pixel first width in a first direction and each imaging pixel has an imaging pixel first width in the first direction, and wherein the readout pixel first width is smaller than the imaging pixel first width.

6. The sensor unit according to claim 5,
wherein the readout pixels in each readout group are more compactly arranged in the first direction than the associated imaging pixels such that one of the at least one street is formed in the first direction between the readout groups, or
wherein each readout group has a first width in the first direction that is smaller than a first width in the first direction of each imaging group such that one of the at least one street is formed in the first direction between the readout groups, and
wherein each imaging pixel in each imaging group is connected to the associated readout pixel in the corresponding readout group.

7. The sensor unit according to claim 1,
wherein each readout pixel has a readout pixel first width in a first direction and a readout pixel second width in a second direction,
wherein each imaging pixel has an imaging pixel first width in the first direction and an imaging pixel second width in the second direction,
wherein the readout pixel first width is smaller than the imaging pixel first width,
and wherein the readout pixel second width is smaller than the imaging pixel second width.

8. The sensor unit according to claim 7,
wherein the readout pixels in each readout group are more compactly arranged in the first direction and in the second direction than the associated imaging pixels such that the at least one street is formed in the first direction and in the second direction between the readout groups, or wherein each readout group has a first width in the first direction and a second width in the second direction that is smaller than a first width in the first direction and a second width in the second direction of each imaging group such that the at least one street is formed in the first direction and in the second direction between the readout groups, and
wherein each imaging pixel in each imaging group is connected to the associated readout pixel in the corresponding readout group.

9. The sensor unit according to claim 1, wherein each interconnection comprises a solder bump.

10. A radiation detector comprising at least one sensor unit according to claim 1.

11. A radiation detector comprising at least two sensor units according to claim 1, wherein an edge imaging pixel of each sensor unit is within one imaging pixel width of an edge imaging pixel of an adjoining sensor unit.

12. The sensor unit according to claim 1, wherein each readout pixel comprises readout pixel electronics with at least one electronic component specific for an associated readout pixel.

13. The sensor unit according to claim 12, wherein the at least one electronic component comprises at least one of an amplifier, a comparator or a counter for counting photon pulses.

14. A method of manufacturing a sensor unit with a conversion element connected to a readout substrate, the method comprising:
providing the conversion element comprising a plurality of imaging pixels,
wherein each imaging pixel is configured to directly convert radiation into an electrical charge and wherein each imaging pixel comprises a charge collection electrode, wherein a plurality of outer edge imaging pixels of the conversion element define boundaries of a conversion element effective area;

providing the readout substrate comprising a plurality of readout pixels,
   wherein a plurality of outer edge readout pixels of the readout substrate define boundaries of a readout substrate effective area,
wherein each readout pixel has a smaller area than an associated imaging pixel of the plurality of imaging pixels, and
   wherein the plurality of readout pixels are arranged in at least two readout groups such that at least one street is formed between the readout groups and a separation between adjacent pixels across a corresponding one of the at least one street is greater than a separation between adjacent pixels within a single readout group of the at least two readout groups, and
connecting each charge collection electrode of the imaging pixels on a surface of the conversion element to a readout electrode of an associated readout pixel on a first surface of the readout substrate by means of an interconnection at a connection position on the charge collection electrode,
   wherein the conversion element effective area has a substantially same area as the readout substrate effective area.

15. The method according to claim 14, wherein the readout substrate includes readout pixel electronics with at least one electronic component specific for each readout pixel and common electronics for at least two readout pixels formed in the at least one street between readout groups of the readout pixels.

16. The method according to claim 15, further comprising:
   etching at least one via through the at least one street of the readout substrate,
      wherein the at least one street is void of the readout pixel electronics for specific readout pixels.

17. The method according to claim 14, further comprising:
   providing a support substrate comprising a plurality of support contact pads and a plurality of transmission lines coupled to the support contact pads; and
   connecting the support contact pads on a surface of the support substrate to one or more of the readout pixels or to common electronics through at least one via on a second surface of the readout substrate, opposite the first surface, by means of an interconnection.

18. The method according to claim 14, wherein connecting the charge collection electrode to the readout substrate or connecting the support substrate to the readout substrate uses at least one of solder bump bonding, direct bonding, or flip-chip bonding.

19. The method according to claim 14, wherein the conversion element effective area is at least 1% larger than the readout substrate effective area.

20. A sensor unit manufactured by the method according to claim 14.

* * * * *